United States Patent
Janietz et al.

(10) Patent No.: US 6,476,184 B1
(45) Date of Patent: Nov. 5, 2002

(54) AROMATIC POLY(1,3,4-HETERODIAZOLES) FOR USE IN OPTICAL DEVICES, ESPECIALLY ELECTROLUMINESCENT COMPONENTS

(75) Inventors: Silvia Janietz, Teltow (DE); Armin Wedel, Teltow (DE)

(73) Assignee: Fraunhofer-Gesellschaft zur Forderung der Angewardten Forschung E.V. (DE)

( * ) Notice: Subject to any disclaimer, the term of this patent is extended or adjusted under 35 U.S.C. 154(b) by 0 days.

(21) Appl. No.: 09/786,016

(22) PCT Filed: Sep. 2, 1999

(86) PCT No.: PCT/EP99/06452

§ 371 (c)(1),
(2), (4) Date: May 24, 2001

(87) PCT Pub. No.: WO00/14144

PCT Pub. Date: Mar. 16, 2000

(30) Foreign Application Priority Data

Sep. 3, 1998 (DE) .......................................... 198 40 195

(51) Int. Cl.[7] .............................................. C08G 73/00
(52) U.S. Cl. ........................ 528/422; 528/288; 528/289; 528/299; 528/302; 528/304; 528/363; 528/364; 528/370; 528/373; 528/397
(58) Field of Search ................................ 528/422, 288, 528/289, 299, 302, 304, 363, 364, 370, 373, 397

(56) References Cited

U.S. PATENT DOCUMENTS 3,385,837 A   5/1968   Fitzgerald et al.
4,476,295 A   10/1984  Stephens

FOREIGN PATENT DOCUMENTS

DE   27 50 202 A1   5/1979
EP   0 622 975 A1   11/1994

OTHER PUBLICATIONS

Yu et al., "Tuning redox behavior and emissive wavelength od conjugated polymers by p–n diblock structures", 1998, Chem Abstract 130: 52896.*
Yu et al. "Synthesis of 1,4–bis(1,3,4–oxadiazol–2–yl)–2, 5–dialkoxybenzene ologothiophene copolymers—conjugated polymers", 1998, Chem Abstract 129: 343775.*
Zhu et al. Comparative study of the thermal properties of related aromatic polyhydrazides and poly(1,3,4–oxadiazole)s, 1996, Chem Abstract 126: 90098.*
Hamciuc et al. "New polyhydrazides and poly(1,3,4–oxadiazoles)s containing pendant phenoxy groups", 1996, Chem Abstract 125: 143441.*

(List continued on next page.)

Primary Examiner—Duc Truong

(74) Attorney, Agent, or Firm—Workman, Nydegger & Seeley

(57) ABSTRACT

Aromatic poly(1,3,4-heterodiazoles) include from 100 to 1,000 repeating units selected from the group consisting of

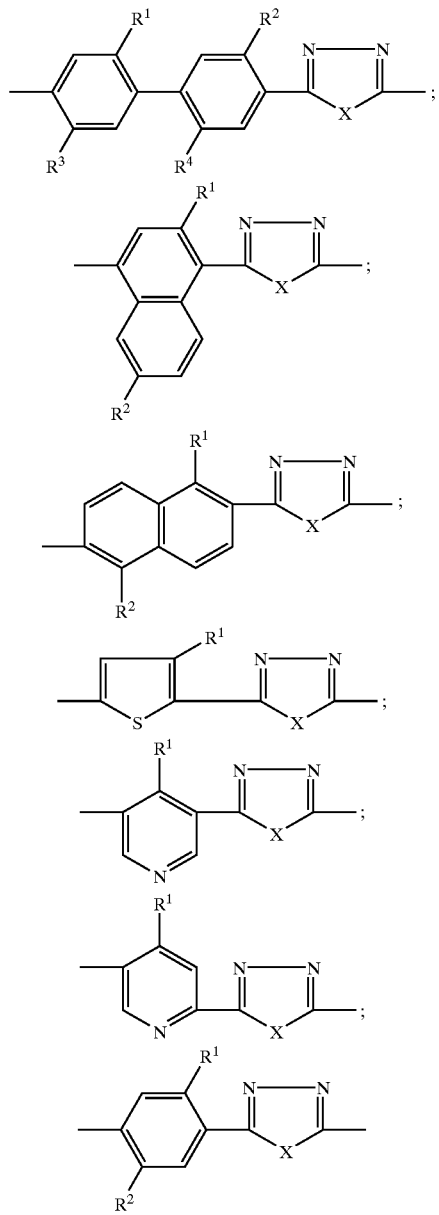

in which $R^1$, $R^2$, $R^3$ and $R^4$ may be identical or different and are each an alkyl, alkoxy, phenyl, phenoxy or thiophenol group and X is S, O or N-phenyl, for use in optical devices, especially electroluminescent components.

19 Claims, No Drawings

OTHER PUBLICATIONS

Emiel G.J. Staring, Robert C.J.E. Demandt, David Braun, Geert L.J. Rikken, Yves A.R.R. Kessener, Ton H.G. Venhuizen, Hans Wynberg, Wolter ten Hoeve, and Krin J. Spoelstra, *Photo– and Electroluminescence Efficiency in Soluble Poly(dialkyul–p–phenylenevinylene)*, Advanced Materials, 1994, 6. No. 12, pp. 934–937.

Xiao–Chang Li, Franco Cacialli, Mark Giles, Johannes Grüner, Richard H. Friend, Andrew B. Holmes, Stephen C. Moratti and Tuck Mun Yong, *Charge Transport Polymers for Light Emitting Diodes*, Advanced mateirals, 1995, 7. No. 11, pp. 898–900.

Elke Buchwald, Martin Meier, Siegfriend Karg, Peter Pösch, Hans–Werner Schmidt, Peter Strohriegl, Water Riess, and Markus Schwoerer, *Enhanced Efficiency of Polymer Light Emmitting Diodes Utilizing Oxadiazole Polymers*, Advanced Materials, 1995, 7. No. 10, pp. 839–842.

Qibing Pei and Yang Yang, *Bright Blue Electroluminescence from an Oxadiazole–Containing Copolymer*, Advanced Materials, 1995, 7. No. 6, pp. 559–561.

Jeffrey W.H. Watthey and Mahesh Desai, *Application of Regioselective Thiophene Lithiation to the Synthesis of Thiophene Analogues of Xanthones and Thioxanthones*, J. Org. Chem., 1982, 47, pp. 1755–1759.

C.W. Tang and S.A. VanSlyke, *Organic electroluminescent diodes*, Applied Phys. Lett. 51 (12), Sep. 21, 1987, pp. 913–915.

Chihaya Adachi, Tetsuo Tsutsui, and Shogo Saito, *Blue light–emitting organic electroluminescent devices*, Appl. Phys. Lett. 56 (9), Feb. 26, 1990, pp. 799–801.

Yuji Hamada, Chihaya Adachi, Tetsuo Tsutsui and Shogo Saito, *Blue–Light–Emitting Organic Electroluminescent Devices with Oxadiazole Dimer Dyes as an Emitter*, Jpn. J. Appl. Phys. vol. 31 (1992), pp. 1812–1816.

A.B. Holmes, D.D.C. Bradley, A.R. Brown, P.L. Burn, J.H. Burroghes, R.H. Friend, N.C. Greenham R.W. Gymer, D.A. Halliday, R.W. Jackson, A. Kraft, J.H.F. Martens, K. Pichler, and I.D.W. Samuel, *Photoluminescence and Electroluminescence in Conjugated Polymeric Systems*, Synthetic Metals, 55–57 (1993), pp. 4031–4040.

Manfred Helbig, Hans–Heinrich Hörhold, *Electrochemical studies on poly–(p–phenylenevinylene)s*, Makromol. Chem. 194 (1994) pp. 1607–1618.

Magnus Granström, Magnus Berggren, Olle Inganäs, *Micrometer– and Nanometer–Sized Polymeric Light–Emitting Diodes*, Science, vol. 267, Mar. 10, 1995, pp. 1479–1481.

Cornelui Hamciuc et al., *New Polyhydrazides and Poly(1, 3,4–oxadiazole)s Containing Pendent Phenoxy Groups*, Die Angewandte Makromolekulare Chemie, 238 (1996) 63–71 (nr. 4154).

\* cited by examiner

AROMATIC POLY(1,3,4-HETERODIAZOLES) FOR USE IN OPTICAL DEVICES, ESPECIALLY ELECTROLUMINESCENT COMPONENTS

CROSS-REFERENCE TO RELATED APPLICATIONS

This application is a filing under 35 U.S.C. §371 of PCT/EP99/06452, filed Sep. 2, 1999, which claims priority to German Application No. 198 40 195.7, filed Sep. 3, 1998.

BACKGROUND OF THE INVENTION

1. The Field of the Invention

The present invention relates to main-chain polymers based on aromatic poly(1,3,4-heterodiazoles) which are suitable for use as the electroluminescent and/or electron-transport layer in optical devices, especially for light-emitting diodes (LEDs), and to a process for preparing them.

2. The Relevant Technology

The utilization of redox-active polymers and organic monomer compounds in optical devices is opening up the possibility of using simple processing techniques to realize large-area displays possessing low operating voltages and an emission over the entire spectral range, which it has not been possible to produce using the existing, conventional inorganic materials. Moreover, in contrast to the liquid-crystal displays, the electroluminescent displays are self-illuminating and therefore require no backlighting source.

Tang and van Slyke were the first to present LEDs based on organic materials (C. W. Tang, S. A. van Slyke; *Appl. Phys. Lett.* 51 (1987) 913). As a result it was possible to increase the luminescence efficiency relative to the inorganic materials and to produce LEDs which emit blue light. The organic multiple or single layers form sandwich structures between a transparent indium-tin oxide (ITO) anode and a metal cathode with a output function, such as Mg, Al or Ca, for example. With the structure of multiple layer systems consisting of electron-transport layer, emitter layer and hole-transport layer it was possible to increase the luminescence efficiency and its stability (C. Adachi, T. Tsutsui, S. Saito; *App. Phys. Lett.* 57 (1990) 531; Y. Hamada, C. Adachi, T. Tsutsui, S. Saito; *Jpn. J. Appl. Phys.* 31 (1992) 1812). Where monomers are used, the layers are realized by means of specific and hence costly vapour deposition techniques. The use of polymers permits a simplified structure of the device.

Conjugated polymers having semiconductor properties with energy gaps of between 3.5 and 1.0 eV, such as the mentioned poly(p-phenylenevinylene) (PPV) or poly-(p-phenylene) (PP), are used as emitters and/or hole-transport layers in the device structure of LEDs. It is necessary to synthesize organic-soluble materials in order to apply these polymers appropriately by means of processes that are simple to manage, such as spin coating or dipping, for example. One synthesis route is the preparation of soluble prepolymers which are converted into the corresponding insoluble conjugated polymers by a subsequent pyrolysis step.

Intense research work into PPV has been carried out, inter alia, by Friend et al. (A. B. Holmes, D. D. Bradley, A. R. Brown, P. L. Burn, R. H. Friend; *Synthetic Metals* 55–57 (1993) 4031, J. H. Burroughes, D. D. C. Bradley, R. H. Friend, EP 0423 283 B1) and by Hörhold et al. (M. Helbig, H. H. Hörhold; *Makromol. Chem.* 194 (1993) 1607; H. H. Hörhold et al. DE 195 05 416 A1). Polymeric and oligomeric thiophenes have also been found to be particularly attractive. They permit the controlled adjustment of the wavelength of the light to be emitted, by variation of the substituents attached to the heterocycle (M. Granström, M. Berggren and O. Inganäs; *Science* 267 (1995) 1479; E. G. J. Staring et al.; *Adv. Mater.* 6 (1994) 934), although the quantum efficiency is unsatisfactory.

The structure of multilayer systems on a polymer basis makes it possible to increase considerably the efficiency of the emitting diodes. As additional layers which both improve the passage of the electrons through the layer and provide a barrier for holes, use has been made to date, inter alia, of side-chain polymers based on polymethacrylate with 1,3,4-oxadiazole groups in the side chain (X.-C. Li, F. Cacialli, M. Giles, J. Grüner, R. H. Friend, A. B. Holmes, St. C. Moratti, T. M. Yong, *Adv. Mater.* 7, 1995, 898) and copolymers with 1,3,4-oxadiazole units in the main chain (E. Buchwald, M. Meier, S. Karg, P. Pösch, H.-W. Schmidt, P. Strohriegel, W. Rieß, M. Schwoerer, *Adv. Mater.* 7, 1995, 839, Q. Pei, Y. Yang, *Adv. Mater.* 7, 1995, 559).

Despite the enormous progress in the use of these materials in LEDs, the components still have limits with regard to service life, photostability, and stability to water and air.

BRIEF SUMMARY OF THE INVENTION

It is an object of the present invention to provide polymers which possess electroluminescence properties and/or electron-transport properties and/or improvement with regard to the target profile of properties of the component as a whole, so that it can be used in illumination or display devices.

The invention provides aromatic poly(1,3,4-heterodiazoles) comprising aromatic poly(1,3,4-heterodiazole) comprising from 100 to 1,000 repeating units selected from the group consisting of

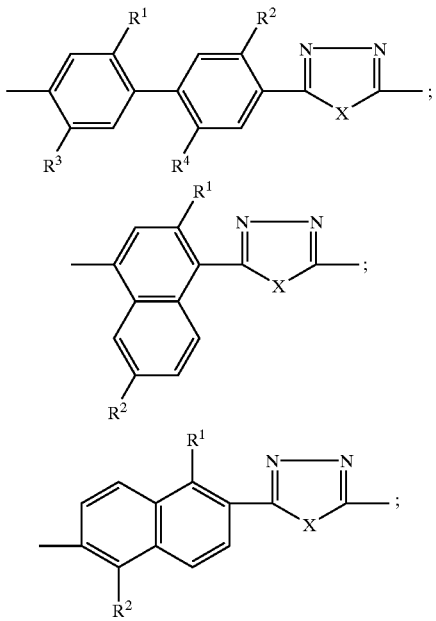

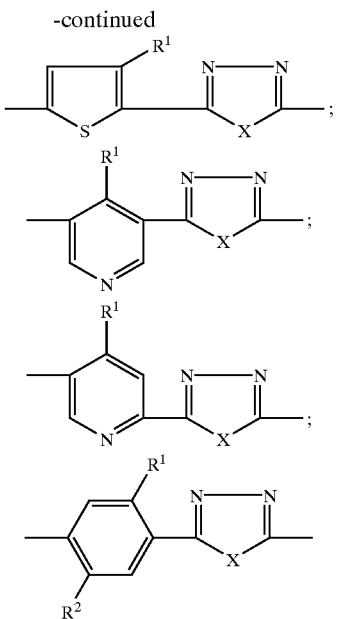

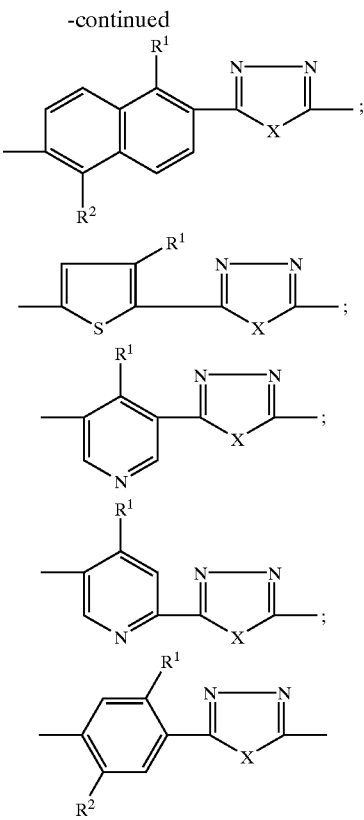

in which $R^1$, $R^2$, $R^3$ and $R^4$ may be identical or different and are each an alkyl, alkoxy, phenyl, phenoxy or thiophenol group and X is S, O or N-phenyl.

One preferred class of the aromatic poly(1,3,4-heterodiazoles) of the invention has the general formula

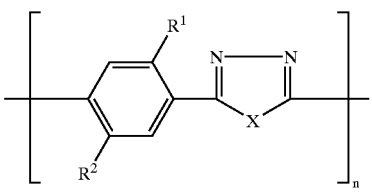

in which $R^1$ and $R^2$ are as defined above and n is an integer from 100 to 1,000.

DETAILED DESCRIPTION OF THE PREFERRED EMBODIMENTS

As discussed above, the present invention provides aromatic poly(1,3,4-heterodiazoles) comprising aromatic poly(1,3,4-heterodiazole) comprising from 100 to 1,000 repeating units selected from the group consisting of

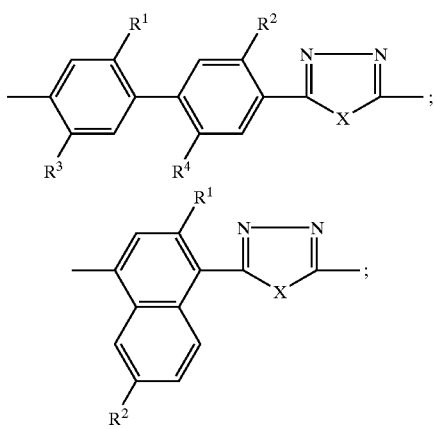

in which $R^1$, $R^2$, $R^3$ and $R^4$ may be identical or different and are each an alkyl, alkoxy, phenyl, phenoxy or thiophenol group and X is S, O or N-phenyl.

One preferred class of the aromatic poly(1,2,4-heterodiazoles) of the invention has the general formula

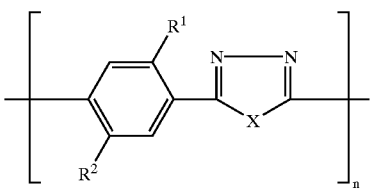

in which $R^1$ and $R^2$ are as defined above and n is an integer from 1 to 1,000.

As already mentioned, the substituents $R^1$ to $R^4$ may be alkyl groups. These generally have 1 to 18 carbon atoms, preferably up to 16 carbon atoms. Similar comments apply to the abovementioned alkoxy group.

The alkyl and alkoxy groups may be linear or branched, and it is preferred to select the substituents $R^1$ and $R^2$ and, if appropriate, $R^3$ and $R^4$ such that one of these radicals is branched while the other radical or radicals is or are linear.

The substituents $R^1$, $R^2$, $R^3$ and $R^4$ may also be abovementioned alkyl and alkoxy groups in which one or more non-adjacent $CH_2$ groups have been replaced by —O— or —S—.

Furthermore, $R^1$, $R^2$, $R^3$ and $R^4$ may be a phenyl, phenoxy or thiophenol group.

The aromatic poly(1,3,4-heterodiazoles) of the invention are prepared by a process which is characterized in that equimolar amounts of an acid dichloride or two or more acid dichlorides, selected from the group consisting of

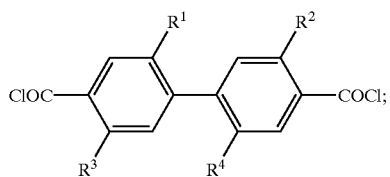

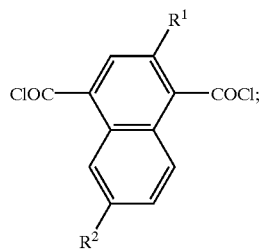

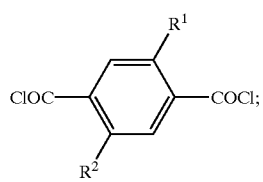

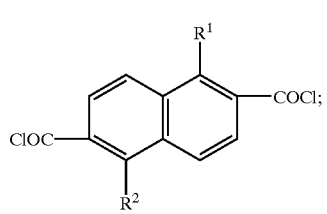

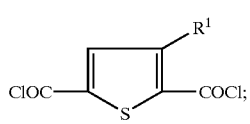

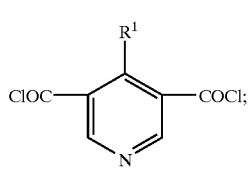

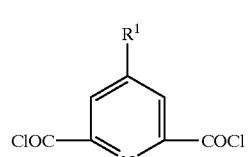

in which $R^1$, $R^2$, $R^3$ and $R^4$ are as defined in claim 1, and of a dicarboxylic hydrazide or two or more dicarboxylic hydrazides, selected from the group consisting of

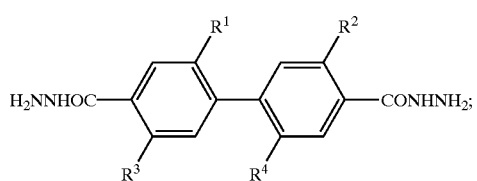

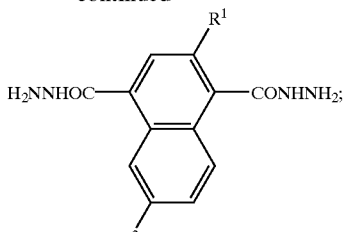

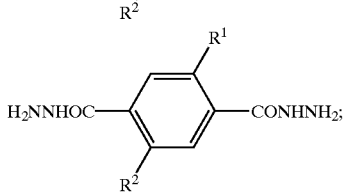

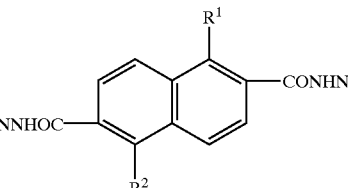

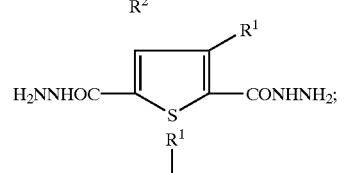

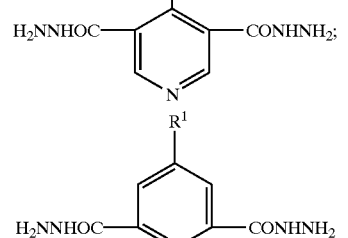

in which $R^1$, $R^2$, $R^3$ and $R^4$ are as defined in claim 1, are subjected to a condensation polymerization, the condensation product is isolated, purified and then subjected to a ring-closure reaction in the presence of a water-withdrawing agent, and then the product is isolated and purified.

The water-withdrawing agent used is preferably phosphorus oxychloride.

Where sulphur or N-phenyl is to be introduced into the heterodiazole ring in place of oxygen, then aniline (to introduce N-phenyl) or phosphorus pentasulphide (to introduce sulphur) is added simultaneously during the ring-closure reaction. Solvents used are preferably benzene, toluene, xylene and 1,2-dichlorobenzene. The reaction temperature is preferably from 80 to 170° C. and the reaction time is from 2 to 20 hours. The polymers obtained are isolated by precipitation from a non-solvent and may be purified by extraction, with alcohols, for example, or by further dissolution and precipitation from a non-solvent.

As already mentioned, the corresponding polyhydrazides are prepared by condensation in solution. Solvents used in this case are preferably benzene, toluene, xylene or 1,2-dichlorobenzene. The reaction temperature is preferably from 80 to 170° C. and the reaction time is from 20 min to 5 h.

For the polycondensation, the corresponding acid dichloride or a mixture of acid dichlorides is dissolved in the aforementioned solvent or a mixture thereof, with heating, and the equimolar amount of one or more of the abovementioned acid dihydrazides in solution is added dropwise.

The condensation takes place judiciously by adding a basic catalyst, preferably pyridine.

The reactions are virtually quantitative. The condensation products obtained are isolated by precipitation, from alcohols, for example, and then purified by extraction with alcohols.

The preparation of the starting compounds takes place in accordance with methods known per se from the literature, such as those described, for example, in standard works on organic synthesis, e.g., Houben-Weyl, Methoden der Organischen Chemie, Georg Thieme Verlag, Stuttgart, or in corresponding relevant journals.

For the synthesis of the thianthrene-containing 1,3,4-oxadiazole-containing polymer, for example, the required starting material is 3-phenoxythiophene-2,5-dicarboxylic acid, whose preparation is described in *J. Org. Chem.* 1982, 47, 1755–1759 (J. W. H. Watthey, M. Desai).

The polymers of the invention generally have from 100 to 1,000, preferably from 200 to 800, with particular preference from 300 to 700 repeating units.

The polymers of the invention are notable inter alia for high stability coupled with a high fluorescence quantum yield, these polymers emitting light in the blue region. Furthermore, on the basis of the 1,3,4-heterodiazole ring, they represent electron-accepting materials having very good barrier properties with regard to holes. The LUMO energies of the polymers provided fit very well with the output of the cathode materials, as has been determined by means of cyclovoltammetric measurements. This fact makes possible the efficient structure of multilayer arrangements.

The invention is based on the surprising finding that it is possible to adjust the electroluminescence by varying the layer thickness. Additionally it was supposed that the application of the aromatic poly(1,3,4-heterodiazoles) would reduce only the operating voltage of the device. As a complete surprise, however, the position of the recombination zone in a multilayer system is also changed in this way, so that the electroluminescence can be tailored by means of the polymeric layers of the invention, by choosing the layer thicknesses.

The heterodiazole-containing main-chain polymers of the invention may also be prepared, inter alia, in the form of layers and films in customary solvents and may therefore be used as electroluminescent and/or electron-transport layers in optical devices. The solubility in organic solvents of such rigid-chain, fully aromatic poly(1,3,4-heterodiazoles) has been achieved by introducing alkyl, alkoxy, thiophenol and/or phenoxy side groups into the polymeric main chain.

For their use as electroluminescent and electron-transport layers in optical devices, the synthesized polymers are applied by spin-coating or cast-on techniques to various solid substrates (ITO on glass substrates) and to flexible conductive polyethylene terephthalate films. The polymer layer thicknesses are between 40 and 500 nm (depending on the layer system) and must be optimized depending on the structure of the optical device.

For the realization of multiple-layer systems, a hole-transport layer is prepared first on the hole-injecting electrode, followed by the electron-transport layer, consisting of the polymers of the invention, atop it. This is followed by the application of an electron-injecting electrode, e.g., Ca, Mg, Al, In, Mg/Ag. The polymer materials used must be tailored to one another in such a way that, for example, mutual incipient dissolution is prevented. The production of injecting contacts is done by means of special multi-crucible resistance vaporization and DC or RF sputtering sources. Suitable hole-injecting electrode materials include those which possess a high output (>4.5 eV). They include gold, platinum, and indium-tin oxide (ITO) layers. The ITO layers (also available commercially: Balzers) must be designed by special vapour deposition techniques (RF sputtering) in such a way that they possess both high transparency (>80%) and a low surface resistance ($<\text{k}\Omega/\text{cm}^2$). The typical layer thicknesses must therefore be between 80 and 150 nm.

In operation, electrodes are injected from the cathode into the electron-transport layer and, respectively, into the light-emitting layer. At the same time, holes are injected from the anode into the hole-transport layer and, respectively, directly into the light-emitting layer. Under the influence of the applied voltage, the charge carriers move towards one another through the active layers. At the interfaces between the charge-transport layers and the light-emitting layer, or directly in the light-emitting layer, respectively, electron/hole pairs are formed which recombine and, in doing so, emit light. The colour of the light emission can be varied, for example, by varying layer thicknesses in a multiple-layer system. The current/voltage characteristic lines and the optical properties (absorption, photoluminescence, electroluminescence) are measured after contacting the electrodes.

The invention is elucidated in more detail by the working examples below, without wishing to restrict it as a result.

WORKING EXAMPLES

Syntheses of the Starting Materials for Preparing poly(2,5-diphenyl{2',5'-di(2-ethylhexyloxy)}-1,3,4-oxadiazole)

2,5-(2-Ethylhexyloxy)diethyl Terephthalate 2,5-Dihydroxydiethyl terephthalate (10 g; 0.04 mol) and 2-ethylhexyl iodide (192 g; 0.8 mol) are dissolved in 250 ml of absolute cyclohexanone. Following the addition of finely powdered $K_2CO_3$ (80 g; 0.58 mol) and KI (1.35 g; 8 mmol), the mixture is refluxed for 5 h under nitrogen. Subsequently, and as far as possible while still hot, the solution is filtered to remove the potassium carbonate and the residue is washed twice with cyclohexanone. The solvent is distilled off and the unreacted 2-ethylhexyl iodide is removed by distillation. This leaves a pale brown oil.

Yield: 14.5 g=76%

| EA: | $C_{28}H_{46}O_6$ (478.7 g/mol) | | |
|---|---|---|---|
| | calc.: C 70.25% | H 9.69% | O 20.05% |
| | found: C 69.75% | H 9.68% | |

2,5-(2-Ethylhexyloxy)terephthaloyl Dihydrazide 2,5-(2-Ethylhexyloxy)diethyl terephthalate (5.5 g; 0.0115 mol) and 10 ml of hydrazine hydrate (0.2 mol) are dissolved in 50 ml of ethanol and the solution is heated at reflux for about 6 h. After the reaction solution has been cooled, the precipitated product is filtered off with suction and dried. The product is subsequently recrystallized from ethanol.

| Yield: 3.21 g = 61% | | m.p.: 68° C. |
|---|---|---|
| EA: $C_{24}H_{42}N_2O_4$(450.6 g/mol) | | |
| calc.: C 63.97% | H 9.39% | N 12.43% |
| found: C 64.0% | H 9.42% | N 12.34% |

2,5-(2-Ethylhexyloxy)terephthalic acid 2,5-(2-Ethylhexyloxy)diethyl terephthalate (5.5 g; 0.0115 mol) is refluxed for 4 h in a solution of KOH (24 g; 0.43 mol) in water (100 ml) and ethanol (40 ml). When the cooled reaction mixture is acidified with concentrated HCl, the dicarboxylic acid is precipitated. It is separated off and dried. Subsequently it is recrystallized from a mixture of water/ethanol (3:5).

| Yield: 3.15 g = 65% | m.p.: 134 to 136° C. |
|---|---|
| EA: $C_{24}H_{38}O_6$(422.5 g/mol) | |
| calc.: C 68.22% | H 9.06% |
| found: C 68.416% | H 9.30% |

2,5-(2-Ethylhexyloxy)terephthaloyl Dichloride 2,5-(2-Ethylhexyloxy)terephthalic acid (3.15 g; 0.0075 mol), 25 ml of thionyl chloride and 2 drops of DMF are stirred at room temperature for 2 days. The excess thionyl chloride is distilled off and the oily residue is dried under an oil pump vacuum.

Yield: 3.39 g=99%

| EA: $C_{24}H_{35}O_2Cl_2$(302.5 g/mol) | |
|---|---|
| calc.: C 70.26% | H 9.68% |
| found: C 71.03% | H 10.23% |

Poly(diphenyl{2,5-di(2-ethylhexyloxy)}hydrazide)

The 2,5-(2-ethylhexyloxy)terephthaloyl dihydrazide (1.78 g; 3.96 mmol) is dissolved in 20 ml of absolute dichlorobenzene, and 1 ml of pyridine is added. The solution is heated with stirring to 130° C. The 2,5-(2-ethylhexyloxy) terephthaloyl dichloride (1.82 g; 3.96 mmol) is dissolved in 10 ml of dichlorobenzene and the solution is slowly added dropwise at 130° C., during which the viscosity of the solution is observed to increase. The condensate solution is subsequently stirred at 160° C. for 1 h. The still-hot condensate solution is precipitated slowly from about 600 ml of methanol, and the precipitate is washed several times with methanol and then subjected to extraction for about 20 h using a Soxhlet apparatus. A fibrous polymer, light yellow in colour, was formed.

Yield: 3.13 g=94%

| EA: $C_{24}H_{38}N_2O_4$(419.0 g/mol) | | | |
|---|---|---|---|
| calc.: C 68.73% | H 9.07% | N 6.68% | O 15.27% |
| found: C 67.23% | H 9.35% | N 6.41% | O 15.30% |

Poly(2,5-diphenyl{2',5'-di(2-ethylhexyloxy)}-1,3,4-oxadiazole) PODH2

Polymer synthesis 2 g of poly(diphenyl{2,5-di(2-ethylhexyloxy)}hydrazide) are suspended in 70 ml of o-dichlorobenzene and 3 ml of phosphorus oxychloride. The reaction solution is subsequently heated to boiling, during which the polyhydrazide dissolves. The reaction solution is left for 3 h. The hot reaction solution is subsequently precipitated in 800 ml of methanol and the precipitate is washed several times with methanol. The bright yellow polyoxydiazole which results, with a strong blue fluorescence, was purified by means of a 22-hour Soxhlet extraction.

Yield: 1.75 g=92%

| EA: $C_{24}H_{36}N_2O_3$(401.0 g/mol) | | | |
|---|---|---|---|
| calc.: C 71.82% | H 8.98% | N 6.98% | O 11.97% |
| found: C 70.28% | H 9.00% | N 7.01% | O 12.55% |

$^{13}$C-NMR (CDCl$_3$)δ=10.9 (CH$_3$); 13.9 (CH$_3$); 30.3, 29.01, 23.7, 22.9 (CH$_2$); 39.4 (CH); 72.2 (CH$_2$O); 114.7, 116.8, 151.4 (aromat. C); 163.3 ppm (oxadiazole C)

$M_w$: 2.54×10$^5$ g/mol (GPC, light scattering)

Device production

To produce an electroluminescent arrangement, the PODH2 was dissolved in an organic solvent (toluene) and was used in a two-layer arrangement as electron-transport material and emitter material.

Applied first to an ITO-coated glass substrate (Balzers) of approximately 25 cm$^2$ is a hole-conducting layer, e.g., polyphenylenevinylene (PPV), having a thickness of 110 nm. This is followed by the application of a PODH2 layer by means of a spin-coating process. The aluminium electrode was structured and has a diameter of 5 mm.

Following contacting of the electrodes (ITO and aluminium) and the application of a negative voltage to the aluminium electrode, different electroluminescence (EL) spectra are found depending on the thicknesses of the PODH2 layers. The layer thicknesses were realized by 3 different concentrations (percent by weight) of a PODH2 solution with the same spin-coating parameter (1 400 min$^-$1). All of the substrates thus prepared were then conditioned at 80° C. in a vacuum cabinet for 2 h. A device arrangement with a PODH2 layer prepared from a 0.25% strength solution shows a green emission at about 8 V. A device prepared with a 0.5% strength PODH2 solution shows a blue-green emission at about 10 V. Finally, a device prepared with a 1.0% strength solution shows a blue emission at 12 V (see table).

| | Layer thickness/nm | EL emission/nm |
|---|---|---|
| PODH2 0.25% | 20 | 525 |
| PODH2 0.50% | 35 | 495 |
| PODH2 1.00% | 55 | 480 |

The reason for the dependency of the EL on the thickness of the electron and/or emitter layer lies in the spatial depth of the recombination zone of the charge carriers, and accordingly the dependency can be adjusted in a targeted manner.

Poly(2,5-diphenyl{2',5'-di(2-ethylhexyloxy)}-1,3-phenyl-4-triazole) POT

Polymer synthesis 1.4 g of aniline (0.015 mol) and 0.23 ml of $POCl_3$ are dissolved in 35 ml of dichlorobenzene at 0° C., with stirring and under a nitrogen atmosphere. Thereafter the cooling is removed and the reaction solution is stirred at room temperature for 1.5 h. 1 g of the poly(diphenyl{2,5-di(2-ethylhexyloxy)}hydrazide) is suspended in a solution and heated at reflux for 24 h. Thereafter, the polymer was precipitated from methanol/water (10:1) and filtered off with suction. The polymer obtained was treated several times with 5% NaOH and then washed with water and methanol.

Yield: 0.75 g=63%

| EA: $C_{30}H_{41}N_3O_2$(475.0 g/mol) | | | |
|---|---|---|---|
| calc.: C 75.79% | H 8.63% | N 8.84% | O 6.74% |
| found: C 73.28% | H 9.20% | N 8.21% | O 8.85% |

$M_w$: $1.81 \times 10^5$ g/mol (GPC, light scattering)

Device production

Applied first to an ITO-coated glass substrate (Balzers) of approximately 25 $cm^2$ was a polyphenylenevinylene (PPV) layer having a thickness of 110 nm. To produce a double-layer arrangement, a solution with toluene and POT was then prepared (1.0% by weight) which was subsequently applied to the PPV layer using a spin-coating process (1 400 $min^{-1}$) and conditioned at 80° C. in a vacuum cabinet for 2 h. The thickness of the POT layer was determined as 60 nm. The aluminium electrode was structured and has a diameter of 5 mm. Following contacting of the electrodes (ITO and aluminium) and the application of a negative voltage of approximately 12 V to the aluminium electrode, a blue electroluminescence at approximately 480 nm was observed.

Poly(2,5-diphenyl{2',5'-di(2-ethylhexyloxy)}-1,3,4-thiadiazole) PTDH 1 g of poly(diphenyl{2,5-di(2-ethylhexyloxy)}hydrazide) (2.39 mmol) and 1 g of $P_2S_5$ (4.5 mmol) are suspended in 35 ml of o-dichlorobenzene and 3 ml of phosphorus oxychloride. The reaction solution is then heated to boiling, during which the polyhydrazide dissolves. The reaction solution is left under these conditions for 12 h. Subsequently, the hot reaction solution is precipitated in 800 ml of methanol and washed several times with methanol. The bright yellow polythiadiazole formed was purified by a 22-hour Soxhlet extraction.

Yield: 0.82 g=63%

| EA: $C_{24}H_{36}N_2O_2S$ (417.0 g/mol) | | | | |
|---|---|---|---|---|
| calc.: C 69.06% | H 8.63% | N 6.71% | O 7.67% | S 7.76% |
| found: C 67.51% | H 9.20% | N 7.21% | O 9.03% | S 7.04% |

$M_w$: $1.41 \times 10^5$ g/mol (GPC, light scattering)

Device production

Applied first to an ITO prepared glass substrate (Balzers) of approximately 25 $cm^2$ was a polyphenylenevinylene (PPV) layer having a thickness of 80 nm. To produce a double-layer arrangement, a solution with toluene and PTDH was then prepared (0.5% by weight) which was subsequently applied to the PPV layer using a spin-coating process (1 400 $min^{-1}$) and conditioned at 80° C. in a vacuum cabinet for 2 h. The thickness of the PTDH layer was determined as 80 nm. The aluminium electrode was structured and has a diameter of 5 mm. Following contacting of the electrodes (ITO and aluminium) and the application of a negative voltage of approximately 8 V to the aluminium electrode, a green electroluminescence at approximately 520 nm was observed.

What is claimed is:

1. Aromatic poly(1,3,4-heterodiazole) comprising from 100 to 1,000 repeating units selected from the group consisting of

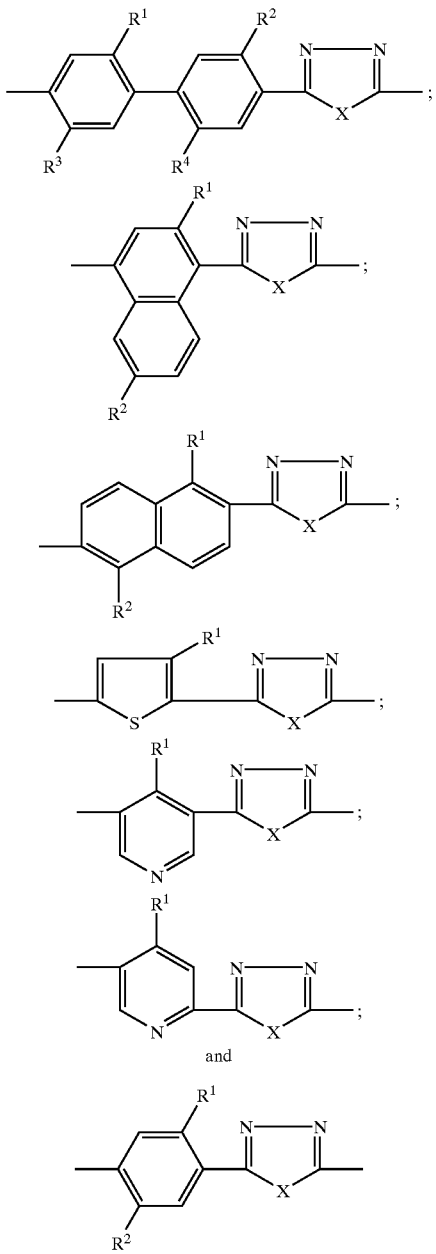

in which $R^1$, $R^2$, $R^3$ and $R^4$ are identical or different relative to each other and are each an alkyl, alkoxy, phenyl, phenoxy or thiophenol group and wherein X is S, O or N-phenyl.

2. Aromatic poly(1,3,4-heterodiazole) according to claim 1, of the general formula

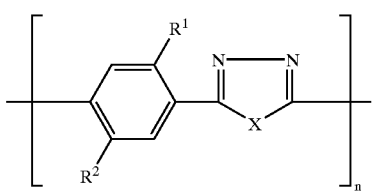

in which $R^1$, $R^2$, $R^3$, $R^4$ and X are as defined in claim 1 and n is an integer in a range from 100 to 1,000.

3. Aromatic poly(1,3,4-heterodiazole) according to claim 1 wherein at least $R^1$ or $R^2$ are an alkyl group in which one or more non-adjacent $CH_2$ groups have been replaced by —O— or —S—.

4. Aromatic poly(1,3,4-heterodiazole) according to claim 2, wherein at least $R^1$ or $R^2$ are an alkyl group in which one or more non-adjacent $CH_2$ groups have been replaced by —O— or —S—.

5. Aromatic poly(1,3,4-heterodiazole) according to claim 1, wherein the number of repeating units is in a range from 300 to 700.

6. Aromatic poly(1,3,4-heterodiazole) according to claim 2, wherein the number of repeating units is in a range from 300 to 700.

7. Aromatic poly(1,3,4-heterodiazole) according to claim 1, wherein the aromatic poly(1,3,4-heterodiazole) comprises poly(2,5-diphenyl{2',5'-di(2-ethylhexyloxy)}-1,3,4-oxadiazole), poly(2,5-diphenyl{2',5'-di(2-ethylhexyloxy)}-1,3-phenyl-4-triazole), or poly(2,5-diphenyl{2',5'-di(2-ethylhexyloxy)}-1,3,4-thiadiazole.

8. A process for preparing an aromatic poly(1,3,4-heterodiazole) according to claim 1, the process comprising:

(a) subjecting to condensation polymerisation equimolar amounts of the following so as to form a condensation product:

(i) an acid dichloride or two or more acid dichlorides selected from the group consisting of

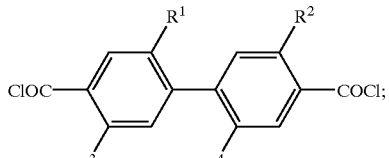

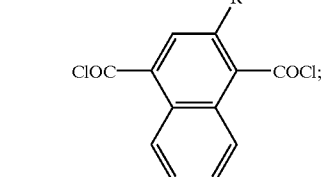

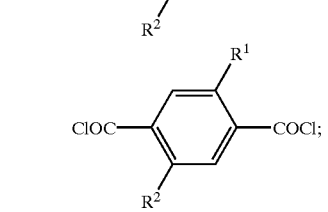

-continued

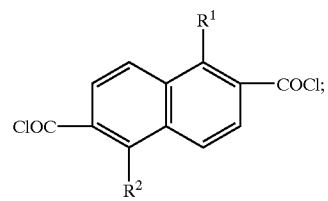

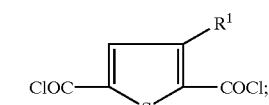

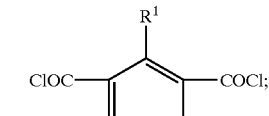

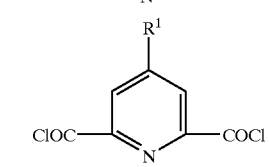

in which $R^1$, $R^2$, $R^3$ and $R^4$ are as defined in claim 1; and (ii) a dicarboxylic hydrazide or two or more dicarboxylic hydrazides selected from the group consisting of

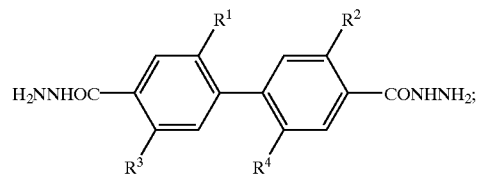

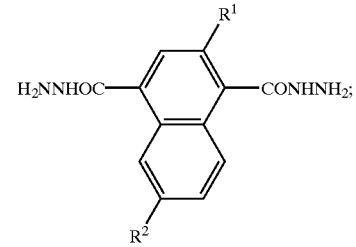

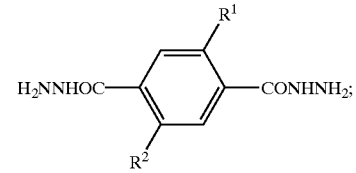

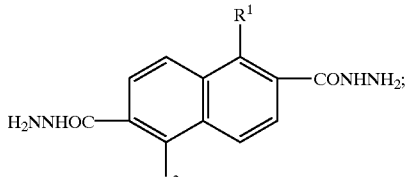

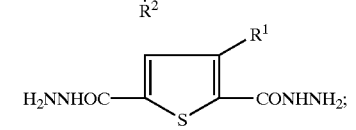

-continued

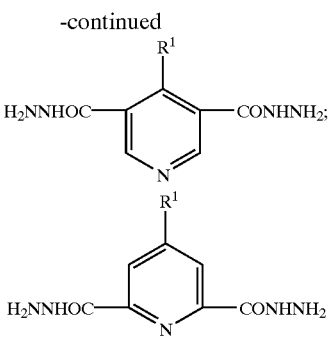

in which R¹, R², R³ and R⁴ are as defined in claim 1;

(b) isolating and purifying the condensation product;

(c) subjecting the purified condensation product to a ring-closure reaction in the presence of a water-withdrawing agent so as to form a final product; and (d) isolating and purifying the final product.

9. The process according to claim 8, wherein the condensation polymerization is conducted in the presence of a basic catalyst.

10. The process according to claim 9, wherein the basic catalyst is pyridine.

11. The process according to claim 9, wherein the water-withdrawing agent comprises phosphorus oxychloride.

12. The process according to claim 10, wherein the water-withdrawing agent comprises phosphorus oxychloride.

13. Process according to claim 9, wherein the ring closure reaction is conducted in the presence of aniline or phosphorus pentasulphide.

14. Process according to claim 12, wherein the ring closure reaction is conducted in the presence of aniline or phosphorus pentasulphide.

15. An optical device comprising one or more aromatic poly(1,3,4-heterodiazoles) according to claim 1.

16. An optical device according to claim 15, wherein the optical device is an electroluminescent component.

17. A method for forming an optical device comprising:
providing a substrate that is at least partially electrically conductive; and
depositing a layer of the aromatic poly(1,3,4-heterodiazole) according to claim 1 over at least a portion of the substrate.

18. A method as recited in claim 17, further comprising positioning a layer of a hole transport material between the substrate and the layer of aromatic poly(1,3,4-heterodiazole).

19. A method as recited in claim 17, wherein the substrate comprises ITO on glass or a conductive film of polyethylene terephthalate.

* * * * *

UNITED STATES PATENT AND TRADEMARK OFFICE
CERTIFICATE OF CORRECTION

PATENT NO.   : 6,476,184 B1
DATED        : November 5, 2002
INVENTOR(S)  : Silvia Janietz and Armin Wedel It is certified that error appears in the above-identified patent and that said Letters Patent is hereby corrected as shown below:

Column 4,
Line 36, before "heterodiazoles" change "1,2,4" to -- 1,3,4 --

Signed and Sealed this

Twenty-fifth Day of February, 2003

JAMES E. ROGAN
*Director of the United States Patent and Trademark Office*